United States Patent
Miyake

(10) Patent No.: US 9,927,509 B2
(45) Date of Patent: Mar. 27, 2018

(54) NON-CONTACT TYPE CURRENT SENSOR AND ASSOCIATED METHODS

(71) Applicant: Keysight Technologies, Inc., Minneapolis, MN (US)

(72) Inventor: Yasuhiro Miyake, Hachioji Tokyo (JP)

(73) Assignee: Keysight Technologies, Inc., Santa Rosa, CA (US)

( * ) Notice: Subject to any disclaimer, the term of this patent is extended or adjusted under 35 U.S.C. 154(b) by 137 days.

(21) Appl. No.: 14/930,252

(22) Filed: Nov. 2, 2015

(65) Prior Publication Data

US 2017/0123036 A1    May 4, 2017

(51) Int. Cl.
*G01R 1/02* (2006.01)
*G01R 35/00* (2006.01)
*G01R 19/00* (2006.01)

(52) U.S. Cl.
CPC ....... *G01R 35/005* (2013.01); *G01R 19/0092* (2013.01); *G01R 1/02* (2013.01)

(58) Field of Classification Search
CPC ............ G01N 27/4163; G01N 23/225; G01N 23/2251; G01R 35/005; G01R 35/00; G01R 15/22; G01R 17/06; G01R 19/0084; G01R 1/203; G01R 31/3613; G01R 15/207; G01R 19/0092; G01R 21/08; G01R 31/08; G01R 31/308; G01R 31/315; G01R 31/3606; G01R 19/00; G06F 3/046; G02B 27/0093; G01D 5/16; G01Q 10/045; G01Q 60/363; G01Q 60/38; G01Q 60/58; H02J 7/025; H04L 25/4902; H04L 27/04
See application file for complete search history.

(56) References Cited

U.S. PATENT DOCUMENTS

| | | | |
|---|---|---|---|
| 6,185,991 B1 * | 2/2001 | Hong | B82Y 35/00 250/307 |
| 8,169,210 B2 * | 5/2012 | Junginger | G01N 27/61 324/456 |

OTHER PUBLICATIONS

Aim & Thurlby Thandar Instruments, "I-prober 520 positional current probe", downloaded on May 14, 2015.
Allegro Microsystems LLC, "Innovative Current Sensor ICs, for Industrial, Consumer and Computer Applications (IC&C)", Nov. 4, 2014.

(Continued)

*Primary Examiner* — Vinh Nguyen

(57) ABSTRACT

A current measurement device is provided for use with a measurement target having a conductive path. The current measurement device includes a non-contact current sensor to be positioned adjacent the conductive path of the measurement target. A calibration current superimposing unit, including a first electrode and a second electrode to be positioned in contact with the conductive path of the measurement target, is configured to output a calibration current to flow through the conductive path between the first electrode and the second electrode. A controller, coupled to the non-contact current sensor and the calibration current superimposing unit, is configured to control the output of the calibration current from the calibration current superimposing unit, and is configured to sample a signal from the non-contact current sensor positioned adjacent the conductive path of the measurement target.

20 Claims, 9 Drawing Sheets

(56) References Cited

OTHER PUBLICATIONS

Keysight Technologies, Inc., Keysight Technologies, Infiniivision Oscilloscope Probes and Accessories, for 2000X-, 3000X-, 4000X-, 6000X-, 5000, 6000, and 7000 Series, Selection Guide Data Sheet 5968-8153EN, Dec. 10, 2014.
Li, et al., "Using Current Surface Probe to Measure the Current of the Fast Power Semiconductors", IEEE Transactions on Power Electronics, vol. 30, No. 6, Jun. 2015, p. 2911-2917.

* cited by examiner

NON-CONTACT TYPE CURRENT SENSOR AND ASSOCIATED METHODS

BACKGROUND

Current measurements on a device under test (DUT) may be performed with a non-contact type current sensor. There are known various types of non-contact current sensors for measuring a current flowing through a cable or a pattern of a printed circuit board. A magnetic sensor is used in many of these current sensors. Known examples of a magnetic sensor include a coil, a Hall element, a magneto-resistive (MR) effect element such as an anisotropic magneto-resistive element (AMR), giant magneto-resistive element (GMR), or tunnel magneto-resistive element (TMR), and a flux gate sensor.

There are known non-contact current probes for measuring a quantity of current flowing through a pattern (or a wire) on a circuit in a non-contact manner through the use of a magnetic sensor. For example, a built-in calibrator may be mounted on a control box, and the non-contact current probe may have a function of correcting measurement sensitivity. However, this function is only effective under certain conditions (pattern width, distance, and angle), and hence has a limit in terms of the shape of the conductive pattern. Moreover, it is necessary to determine an angle between the probe and the conductive pattern and positions of the probe and the conductive pattern with high precision. The measured value may vary depending on the position of the probe relative to a conductor and the size of the conductor.

Accordingly, such a current probe has a limit in terms of the shape of the conductive pattern, and the conductive pattern needs to be relatively thick. Furthermore, it may be necessary to fix the probe after determining the distance and angle of the probe with respect to the conductive pattern with high precision, and the user performing a measurement must correct the measurement sensitivity at the determined distance and angle.

There is a known current sensor IC for guiding a current to be measured in an IC package and performing current measurements through the use of a Hall element. Calibration may be performed at a factory at the time of manufacture, but due to a limitation in terms of a current path, it is necessary to cut the current path, connect the current path via the current sensor IC, and cause a current to be measured through this current sensor IC.

There is also a known current sensor where the tip of the probe is shaped like a crocodile clip. Due to a limitation in terms of a current path, only a current flowing through a cable is measured, and due to the probe shape it is necessary to pinch the cable so that the cable passes through a loop hole of the tip.

It may be desired to provide accurate current measurement of a measurement target without the need to change a flow of the current path by cutting the path, or surrounding the path with a sensor. Accurate calibration of the sensor is also needed.

SUMMARY

In accordance with a representative embodiment, a current measurement device is 0provided for use with a measurement target having a conductive path. The measurement target may be a device under test (DUT) or portion thereof that may include a printed circuit board (PCB) conductive pattern, a wire, a lead, or a component or device such as an inductor, transistor, DC/DC converter or operational amplifier (op-amp), for example.

The current measurement device includes a non-contact current sensor to be positioned adjacent the conductive path of the measurement target. A calibration current superimposing unit, including a first electrode and a second electrode to be positioned in contact with the conductive path of the measurement target, is configured to output a calibration current to flow through the conductive path between the first electrode and the second electrode. A controller, coupled to the non-contact current sensor and the calibration current superimposing unit, is configured to control the output of the calibration current from the calibration current superimposing unit, and is configured to sample a signal from the non-contact current sensor positioned adjacent the conductive path of the measurement target.

In certain embodiments, the calibration current superimposing unit comprises a floating current source comprising a first output terminal and a second output terminal, an amplifier connected to the first output terminal of the floating current source, and a floating ground terminal connected to the second output terminal of the floating current source.

In certain embodiments, the floating current source comprises a signal source, a signal isolator configured to output an output of the signal source to the first output terminal and the second output terminal, and a ground terminal connected to an output of the signal source, and insulated from the floating ground terminal.

In various embodiments, the calibration current superimposing unit may be configured to output the calibration current having a signal component of a first amplitude at a first frequency. The calibration current superimposing unit may be configured to output the calibration current as a pulse waveform. The calibration current superimposing unit may be configured to output the calibration current as an M-sequence waveform.

In certain embodiments, a first positioner and a second positioner are configured to position the first electrode and the second electrode, respectively, to be in contact with the conductive pattern of the DUT. Also, a third positioner may position the sensor adjacent the conductive path of the measurement target.

Another embodiment is directed to a method of measuring a current flowing through a measurement target with a current measurement device that includes a non-contact current sensor and a calibration current superimposing unit comprising a first electrode and a second electrode. The method includes: positioning the non-contact current sensor adjacent a conductive pattern of the measurement target; positioning the first electrode and the second electrode in contact with the conductive pattern of the measurement target; causing a calibration current to flow through the measurement target between the first electrode and the second electrode from the calibration current superimposing unit; and measuring a signal from the non-contact current sensor adjacent the conductive pattern of the measurement target.

In certain embodiments, the calibration current includes a predetermined characteristic, and the method further includes: extracting a component corresponding to the predetermined characteristic of the calibration current by analyzing the measured signal; acquiring a transfer function of the measurement target from the extracted component; and acquiring a corrected current value through use of the transfer function.

In certain embodiments, the method further includes stopping flow of the calibration current after measuring; and wherein acquiring the corrected current value comprises measuring a subsequent signal from the non-contact current sensor and acquiring the corrected current value by applying the transfer function to the subsequent measured signal.

In certain embodiments, acquiring the corrected current value comprises acquiring the corrected current value by applying the transfer function to a value of the measure signal.

In certain embodiments, the predetermined characteristic of the calibration current may be a signal component of a first amplitude at a first frequency. The predetermined characteristic of the calibration current may be a plurality of predetermined frequency components; and wherein acquiring the transfer function comprises avoiding using one of the plurality of predetermined frequency components to acquire the transfer function based upon a deviation of an amplitude extracted for the one of the plurality of predetermined frequency components of the calibration current.

In certain embodiments, positioning the first electrode and the second electrode comprises positioning the first electrode and the second electrode through use of a first positioner and a second positioner, respectively. Also, positioning the non-contact current sensor may include positioning the non-contact current sensor, adjacent the conductive pattern of the measurement target, through use of a third positioner.

Another embodiment is directed to a method of measuring a current flowing through a measurement target with a current measurement device that includes a non-contact current sensor, and a calibration current superimposing unit comprising a first electrode and a second electrode. The method includes: positioning the non-contact current sensor adjacent a conductive pattern of the measurement target; positioning the first electrode and the second electrode in contact with the conductive pattern of the measurement target; causing a calibration current having a predetermined characteristic to flow through the measurement target between the first electrode and the second electrode from the calibration current superimposing unit; acquiring a first waveform by measuring a voltage signal from the non-contact current sensor adjacent the conductive pattern of the measurement target; stopping flow of the calibration current; acquiring a second waveform by measuring a second voltage signal from the non-contact current sensor; extracting a component corresponding to the predetermined characteristic of the calibration current by analyzing the first waveform and the second waveform; acquiring a transfer function of the measurement target from the extracted component; and acquiring a corrected current value through use of the transfer function.

In certain embodiments, extracting the component corresponding to the predetermined characteristic comprises subjecting each of the first waveform and the second waveform to a frequency analysis to calculate a difference in amplitude at a predetermined frequency.

In certain embodiments, acquiring the corrected current value comprises applying the transfer function to a value of the second waveform to acquire the corrected current value.

In certain embodiments, positioning the first electrode and the second electrode comprises positioning the first electrode and the second electrode through use of a first positioner and a second positioner, respectively, and wherein positioning the non-contact current sensor comprises positioning the non-contact current sensor through use of a third positioner.

The present embodiments provide methods, devices and systems that may provide accurate current measurement of a measurement target without the need to change a flow of the current path by cutting the path, or surrounding the path with a sensor.

It is possible to calibrate the current sensor even under the state in which the circuit including the target current path does not operate.

It is possible to provide the present accurate measurement approach not only when the current sensor is fixed by a positioner, but also when the current sensor is handheld, when measurement is performed in an environment in which vibration or temperature change is large, or when the measurement target shows significant non-linearity.

Examples of measurement systems include oscilloscopes (real time and equivalent time), vector network analyzers, and vector signal analyzers.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

FIG. 3b is a block diagram illustrating an embodiment of the floating current source of FIG. 3a.

DETAILED DESCRIPTION

Figure 1:
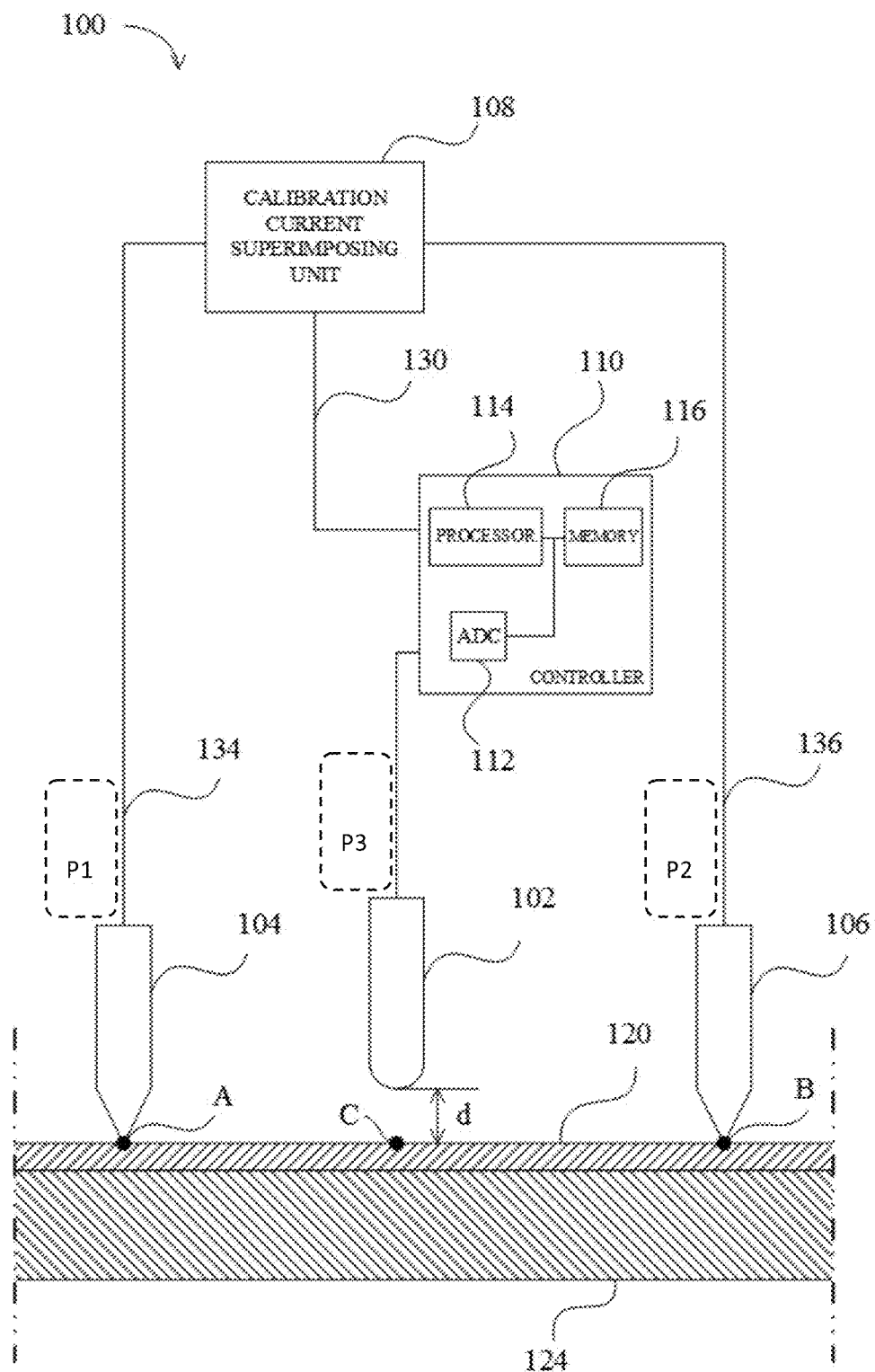
FIG. 1 is a block diagram of a current measurement device according to a first embodiment.

In the following detailed description, for purposes of explanation and not limitation, example embodiments disclosing specific details are set forth in order to provide a thorough understanding of an embodiment according to the present teachings. However, it will be apparent to one having ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical and scientific meanings of the defined terms as commonly understood and accepted in the technical field of the present teachings.

As used in the specification and appended claims, the terms 'a', 'an' and 'the' include both singular and plural referents, unless the context clearly dictates otherwise. Thus, for example, 'a device' includes one device and plural devices.

Relative terms may be used to describe the various elements' relationships to one another, as illustrated in the accompanying drawings. These relative terms are intended to encompass different orientations of the device and/or elements in addition to the orientation depicted in the drawings.

It will be understood that when an element is referred to as being "connected to" or "coupled to" another element, it can be directly connected or coupled, or intervening elements may be present.

'Computer memory' or 'memory' is an example of a computer-readable storage medium. Computer memory is any memory which is directly accessible to a processor. Examples of computer memory include, but are not limited to: RAM memory, registers, and register files. References to 'computer memory' or 'memory' should be interpreted as possibly being multiple memories. The memory may for instance be multiple memories within the same computer system. The memory may also be multiple memories distributed amongst multiple computer systems or computing devices.

A 'processor' as used herein encompasses an electronic component which is able to execute a program or machine executable instruction. References to the computing device comprising "a processor" should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. Many programs have their instructions performed by multiple processors that may be within the same computing device or which may even be distributed across multiple computing devices.

A 'user interface' as used herein is an interface which allows a user or operator to interact with a computer or computer system. A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer to indicate the effects of the operator's control or manipulation. The display of data or information on a display or a graphical user interface is an example of providing information to an operator. The receiving of data through a touch screen, keyboard, mouse, trackball, touchpad, pointing stick, graphics tablet, joystick, gamepad, webcam, headset, gear sticks, steering wheel, wired glove, wireless remote control, and accelerometer are all examples of user interface components which enable the receiving of information or data from an operator.

A 'hardware interface' as used herein encompasses an interface which enables the processor of a computer system to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, Bluetooth connection, Wireless local area network connection, TCP/IP connection, Ethernet connection, control voltage interface, MIDI interface, analog input interface, and digital input interface.

A 'display' or 'display device' as used herein encompasses an output device or a user interface adapted for displaying images or data. A display may output visual, audio, and or tactile data. Examples of a display include, but are not limited to: a computer monitor, a television screen, a touch screen, tactile electronic display, Braille screen, Cathode ray tube (CRT), Storage tube, Bistable display, Electronic paper, Vector display, Flat panel display, Vacuum fluorescent display (VF), Light-emitting diode (LED) displays, Electroluminescent display (ELD), Plasma display panels (PDP), Liquid crystal display (LCD), Organic light-emitting diode displays (OLED), a projector, and Head-mounted display.

Initially, it is pointed out that to design, characterize, and troubleshoot devices and systems (e.g. a device under test (DUT) or portion thereof that may include a printed circuit board (PCB) conductive pattern, a wire, a lead, or a component or device such as an inductor, transistor, DC/DC converter or op-amp, for example), engineers need to measure a variety of characteristics of the device signals. To make such measurements, engineers generally use a network analyzer or oscilloscope and associated probing system and display.

Figure 2:
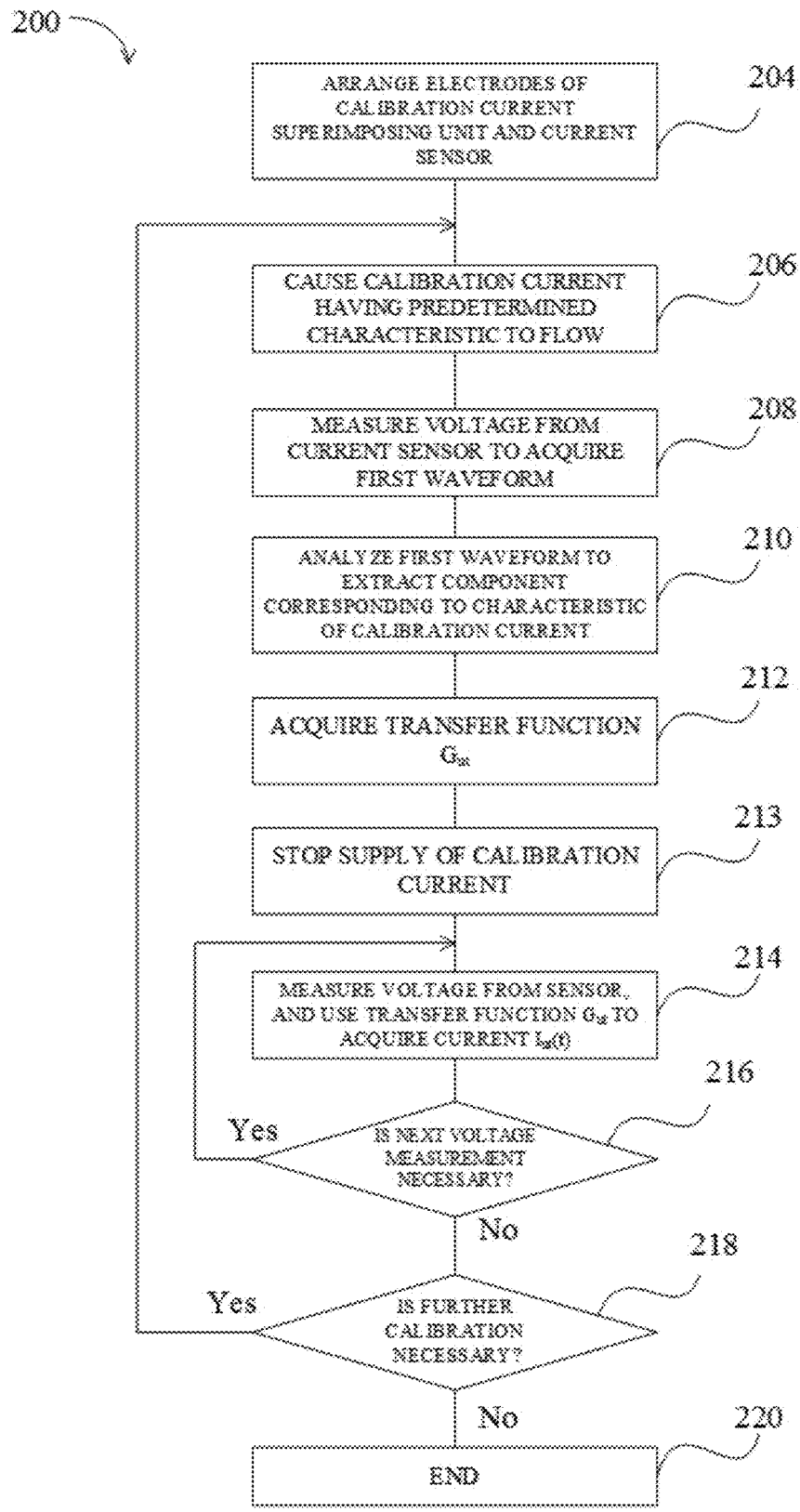
FIG. 2 is a flowchart for illustrating a current measurement method to be performed by the device of FIG. 1.

Referring initially to FIG. 1, a representative embodiment of a current measurement device using a non-contact current sensor according to a first embodiment will be described. FIG. 2 is a flowchart of a current measurement method using the non-contact current sensor.

A current measurement device 100 of FIG. 1 includes a non-contact current sensor 102, a calibration current superimposing unit 108 for calibrating a current measured by the current sensor 102, and a controller 110 for controlling these components.

The calibration current superimposing unit 108 includes a first electrode 104 and a second electrode 106, which are connected via a first line or first cable 134 and a second line or second cable 136, respectively, and is further connected to the controller 110 through a control line 130. The first and second electrodes 104 and 106 are positioned to be in contact with a current path, that is, a conductive pattern 120, which is illustrated in FIG. 1 as a partial cross-section, at a point A and a point B, respectively. The controller 110, via the calibration current superimposing unit 108 and the electrodes 104 and 106, is capable of causing a current to flow through the conductive pattern 120 between point A and point B in a superimposing manner. Note that the conductive pattern 120 is arranged on a substrate 124 (for example, a PCB), which is illustrated in FIG. 1 as a partial cross-section.

In FIG. 1, the current sensor 102 faces a point C of the conductive pattern 120 (that is, a measurement target portion) and the current sensor 102 is spaced apart from the point C with a distance d. Freely selected points may be set as the points A to C. When a surface of the conductive pattern 120 is covered with a solder resist or the like, the points A and B at which the electrodes 104 and 106 are in contact with the conductive pattern 120 may be portions that are not covered with the solder resist or the like, such as exposed portions of a terminal of an element. Note that, alternatively, the points A and B may be portions obtained by partially removing a film, which is formed on the conductive pattern 120.

Note that, the current sensor 102 may be a non-contact magnetic sensor, and various types of commercially available magnetic sensors may be used as the current sensor 102. The distance d may be set to 0 mm or more.

The current sensor 102 and the electrodes 104 and 106 may be arranged by fixing the sensors at desired positions through the use of positioners (P1, P2 and P3 in FIG. 1). Through the use of the positioners P1-P3, it is possible to stably bring the electrodes 104 and 106 into contact with the conductive pattern 120 and stably position the current sensor 102, and hence, it is possible to acquire a stable measured value. As such a positioner P1-P3, a probe positioner such as manufactured by Keysight Technologies may be used.

The controller 110 includes a processor 114, a memory 116, an A/D converter (ADC) 112, and these components are connected to one another. The controller 110 samples a signal from the current sensor 102 and stores the sampled data in the memory 116. Furthermore, the processor 114 is capable of operating in accordance with a program stored in the memory 116 to perform various types of calculation on various types of data stored in the memory 116.

Furthermore, the controller 110 may be connected to an output device such as a display/printer, an input device such as a keyboard/mouse, and a network such as a LAN/WAN, which are not shown here. Such components may be coupled via a hardware interface or wirelessly as would be appreciated by those skilled in the art.

In this case, as the processor 114, a processor such as a commercially-available central processing unit (CPU), an embedded processor, an application specific integrated circuit (ASIC), a programmable logic device (PLD), a field-programmable gate array (FPGA), or the like may be used, but the present embodiments are not limited to these processors.

Still further, the memory 116 may include a read-only memory (ROM), an erasable programmable read-only memory (EPROM), an electrically erasable programmable read-only memory (EEPROM), a random access memory (RAM), a flash memory, or another non-volatile or volatile memory, but the present embodiments are not limited to these memories. In the memory 116, the program to be executed by the processor 114 and data to be used in the program may be further stored. Moreover, the memory 116 may include various types of storage devices such as a hard disk drive (HDD), a floppy disk drive (FDD), a CD drive in which various types of CDs may be used, a DVD drive in which various types of DVDs may be used, and a Blu-ray disc drive in which various types of Blu-ray discs may be used.

Note that, the processor 114 may be a computer dedicated to electronic measurement or a commercially-available computer, or may be a commercially available computer having installed therein an operating system (OS) as are known to those skilled in the art.

Next, a current measurement method to be performed by the current measurement device 100 of FIG. 1 is illustrated in FIG. 2. In the flowchart of a current measurement method 200 of FIG. 2, first, in Step 204, the electrodes 104 and 106 of the calibration current superimposing unit 108 are arranged by bringing these electrodes into contact with the points A and B of the conductive pattern 120 as predetermined points, and the current sensor 102 is arranged at a predetermined position near a predetermined point of the conductive pattern 120, namely, the point C. In this manner, it is possible to cause a calibration current to flow through the measurement target portion (point C) of the conductive pattern 120. In order to arrange the electrodes 104 and 106 and the current sensor 102, the positioners P1-P3 may be used.

Next, in Step 206, a calibration current $I_{cal}(t)$ having a predetermined characteristic is output from the calibration current superimposing unit 108, and is superimposed on a current $I_{ut}(t)$ flowing through a section A-B of the conductive pattern 120. In this case, the calibration current $I_{cal}(t)$ having the predetermined characteristic may be, for example, a current having frequency components (signal components) of an amplitude $A_1$ and a frequency $f_1$. Furthermore, as described later, a current having other various characteristics may also be used. The calibration current $I_{cal}(t)$ is, as an example, a current signal minimally interfering with the current $I_{ut}(t)$. For example, the calibration current $I_{cal}(t)$ may be a current signal having such a characteristic that its signal component does not interfere, at a specific frequency, with a current flowing through a measurement target before the calibration current is caused to flow. In other words, the calibration current $I_{cal}(t)$ may be such a current signal as to enable a correlation with $I_{ut}(t)$ to be ignored. In the case of this example, it is desired that the current $I_{ut}(t)$ flowing through the conductive pattern 120 minimally interfere with the current $I_{cal}(t)$ at the frequency $f_1$. Furthermore, it is desired that the amplitude $A_1$ have such an amplitude (e.g. a relatively small amplitude) as not to change operating points of other portions, such as a bias of a circuit of the conductive pattern 120. Still further, it is desired that an impedance between the electrodes 104 and 106 of the calibration current superimposing unit 108 be, for example, equivalent to or higher than that of a probe of a commercially available oscilloscope in order to prevent oscillation of the circuit of the conductive pattern 120.

Next, in Step 208, the controller 110 measures, that is, samples a voltage signal from the current sensor 102 to acquire a first waveform.

Next, in Step 210, the controller 110 analyzes the first waveform to extract a component corresponding to the characteristic of the calibration current. As an example, in Step 210, the controller 110 subjects the first waveform to a frequency analysis to extract a measured value $A_{m1}$ of an amplitude component at the frequency $f_1$ corresponding to the characteristic of the calibration current. Note that, a Fourier transform such as fast Fourier transform (FFT) or the like is used as the frequency analysis.

Next, in Step 212, based on the extracted component, the controller 110 acquires a transfer function $G_{ut}$ from the current path of the section A-B, namely, the current flowing through the conductive pattern 120, to a measured voltage obtained by the current sensor 102. In the above-mentioned example, based on the measured value $A_{m1}$, the controller 110 acquires the transfer function $G_{ut}$ as follows.

First, when the current flowing through the section A-B of the conductive pattern 120, namely, a current under test, is represented by $I_{ut}(t)$ and the measured voltage obtained by the current sensor 102 at this time is represented by $V_{ut}(t)$, $I_{ut}(t)$ and $V_{ut}(t)$ may be expressed by the transfer function $G_{ut}$ as the following expression.

$$V_{ut}(t)=I_{ut}(t)*G_{ut} \quad (1)$$

In this case, the transfer function Gut depends on sensitivity of the current sensor 102, the shape of the conductive pattern 120, such as the size thereof, of the section A-B through which the current under test $I_{ut}(t)$ flows, an angle θ of a normal to a sensitivity axis of the current sensor 102 with respect to the conductive pattern 120 of the section A-B, and the distance d to the conductive pattern 120 of the section A-B.

When the calibration current $I_{cal}(t)$, which is predetermined, is caused to flow through the conductive pattern 120 of the section A-B through which the current under test flows, a measured voltage $V_m(t)$ obtained by the current sensor 102 at this time may be a combination of a voltage component $V_{cal}(t)$ contributed by $I_{cal}(t)$ and a voltage component $V_{ut}(t)$ contributed by the current under test, and the following expression may be derived as a result.

$$V_m(t)=V_{ut}(t)+V_{cal}(t)=(I_{ut}(t)+I_{cal}(t))*G_{ut} \quad (2)$$

Therefore, the transfer function $G_{ut}$ may be calculated by the following expression by extracting the component $V_{cal}(t)$ from $V_m(t)$.

$$G_{ut}=V_{cal}(t)/I_{cal}(t) \quad (3)$$

Note that, when the calibration does not need to be performed again after Step 212 is finished, it is possible to remove the arranged first and second electrodes 104 and 106.

Next, in Step 213, the controller 110 stops the supply of the calibration current from the calibration current superimposing unit 108. Therefore, after that, the current measured by the current sensor 102 no longer includes the calibration current.

Next, in Step 214, the controller 110 uses the current sensor 102 to newly measure the voltage $V_{ut}(t)$ that is based on the current flowing through the conductive pattern 120, and uses the transfer function $G_{ut}$ to calculate a corrected current value $I_{ut}(t)$ based on the following expression.

$$I_{ut}(t)=V_{ut}(t)/G_{ut} \quad (4)$$

In the manner described above, it is possible to perform the calibration operation of using the calibration current superimposing unit 108 to superimpose the calibration current on the conductive pattern 120 and using the current sensor 102 to calculate the transfer function $G_{ut}$ and to acquire the corrected current value.

Next, in Step 216, it is determined whether or not the next voltage measurement is necessary. When the next voltage measurement is necessary, the processing returns to Step 214. When the next voltage measurement is unnecessary, the processing proceeds to Step 218.

In Step 218, it is determined whether or not further calibration is necessary. When further calibration is necessary, the processing returns to Step 206. When further calibration is unnecessary, the processing proceeds to Step 220, and then the processing ends.

Note that, in a case in which the processing returns from Step 218 to Step 206, when the electrodes 104 and 106 are removed as described above after Step 212, a step of arranging the electrodes 104 and 106 again may be added so as to enable the processing to return to Step 206. Furthermore, Step 213 may be executed at any position after Step 208, and before Step 214.

As described above, according to the current measurement method 200 using the non-contact current sensor 102 of the first embodiment herein, the unknown transfer function $G_{ut}$ is estimated, and the estimated $G_{ut}$ is used to acquire the current $I_{ut}(t)$ based on the measured voltage $V_{ut}(t)$.

Furthermore, it is to be understood that the method of calculating the transfer function $G_{ut}$ has an advantage in that there is no need to accurately measure the angle θ of the normal to the sensitivity axis of the current sensor 102 with respect to the conductive pattern 120 of the section A-B, and the distance d to the conductive pattern 120 of the section A-B.

Furthermore, it is to be understood that in the method 200, the position at which the current sensor 102 is arranged may be maintained during a period from Step 204 to Step 220. Thus, it is possible to maintain highly precise current measurement.

Furthermore, it is to be noted that although the positions where the electrodes 104 and 106 of the calibration current superimposing unit 108 are arranged may need to be maintained during Step 206, after Step 206 is executed once, when Step 206 is executed next, the calibration may be performed even by arranging the electrodes 104 and 106 at different positions from the previous ones as long as the calibration current may be superimposed on the point C of the conductive pattern 120.

Furthermore, the calibration operation of Steps 206 to 213 of the method 200 may be performed not only when the circuit of the conductive pattern 120 actually operates but also when the circuit of the conductive pattern 120 does not actually operate, that is, when the power of the circuit is turned off. It is to be noted that in that case, the circuit of the conductive pattern 120 needs to form a circuit that is connected in the section of the points A and B in Steps 206 to 213. It is to be noted that if Steps 206 to 213 are performed under a state in which the circuit of the conductive pattern 120 does not operate, the interference of the calibration current with the current under test may not always need to be taken into consideration.

Figure 4A:
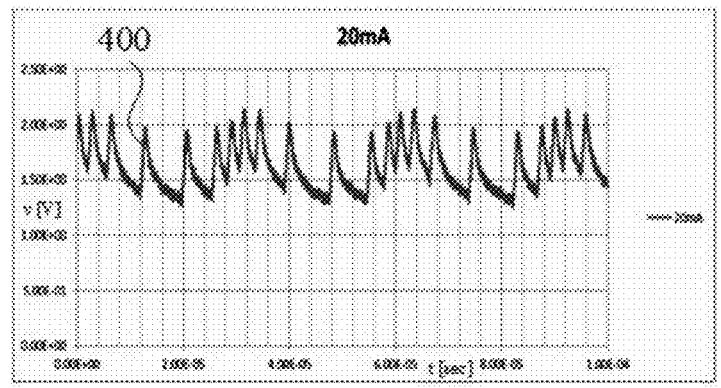
FIG. 4a is a graph showing an example of a measured waveform of a current flowing through a current path obtained by a current sensor to show an effect achieved by the present embodiments.
Figure 4B:
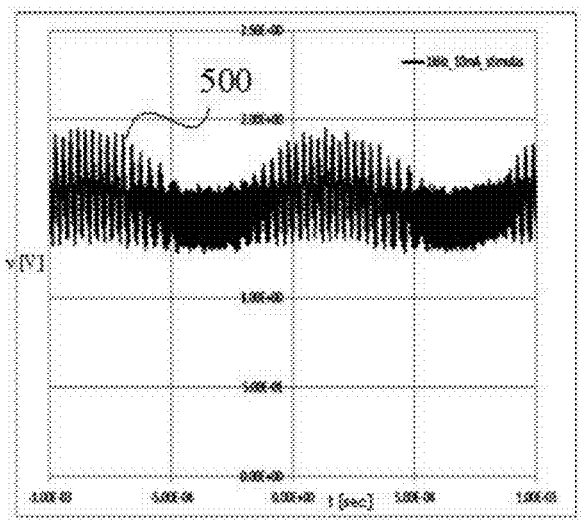
FIG. 4b is a graph showing a measured waveform obtained by the current sensor when the calibration current is caused to flow through the current path of FIG. 4a to show an effect achieved by the present embodiments.
Figure 4C:
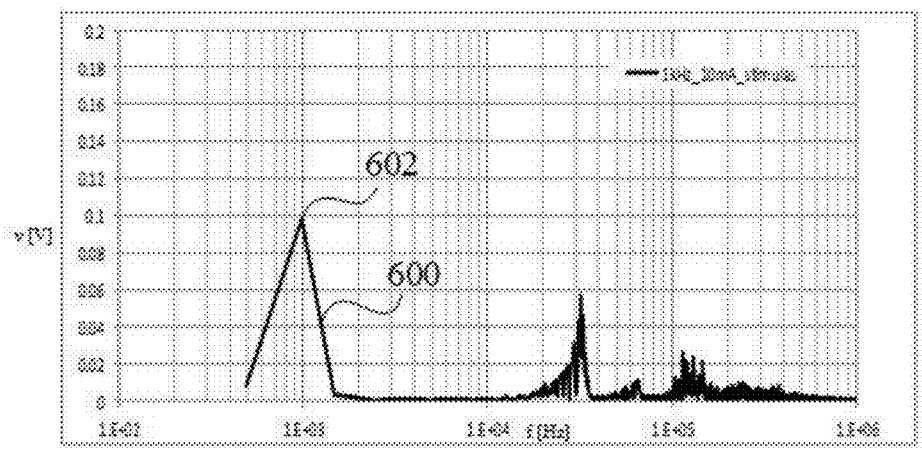
FIG. 4c is a graph showing a result of subjecting the measured waveform of FIG. 4b to a Fast Fourier Transform (FFT).

Another advantageous effect of the method 200 according to the first embodiment is described below. First, a current flowing through the conductive pattern 120 before Step 206 was measured by the current sensor 102 to observe a voltage waveform 400 shown in FIG. 4(a) as the voltage waveform $V_{ut}(t)$. In Step 206, the calibration current superimposing unit 108 superimposed the calibration current of $f_1$=1 KHz and $A_1$=10 mA and a current was measured by the current sensor 102, and then a voltage waveform 500 shown in FIG. 4(b) was measured as the voltage waveform $V_m(t)$. Furthermore, in Step 210, this voltage waveform $V_m(t)$ was subjected to FFT as a frequency analysis to obtain a result 600 shown in FIG. 4(c) as a result of the FFT, and as a result of extracting a component at 1 kHz as the frequency $f_1$ of the calibration current, a voltage having an amplitude of 98.55 mV at 1 kHz was obtained. As a result, $G_{ut}$=9.855 V/A was obtained in Step 212.

In order to verify this result, a known DC current was caused to flow through the conductive pattern 120 of FIG. 1 and $G_{ut}$ was acquired by the method 200, and $G_{ut}$=9.83 V/A was acquired. As a result, it was verified that because this $G_m$ differs from that obtained when 1 kHz was used by 0.25%, the measurement was sufficiently highly precise.

Furthermore, another aspect of the advantageous effect of the method 200 is considered as follows. Hitherto, when the current path and the normal to the sensitivity axis of the current sensor 102 form the angle θ as illustrated in FIG. 5(a), a measurement result contains the following error for θ=5 deg.

1−cos(5 deg)=0.38%

Therefore, it may be necessary to perform highly precise angle alignment.

Figure 5A:
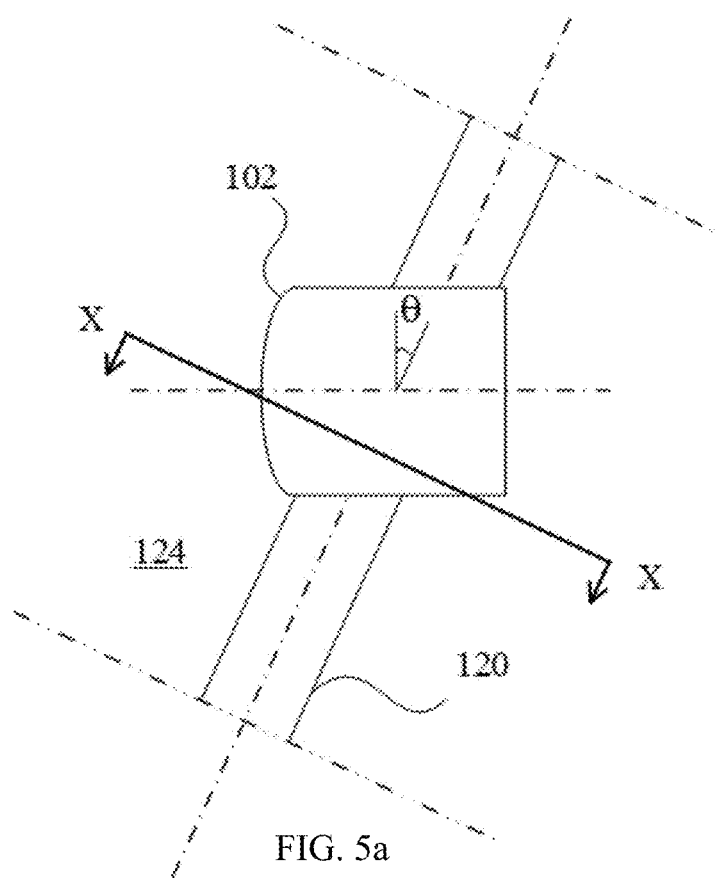
FIG. 5a is a diagram illustrating an error due to deviation in angle between the current path and the sensor.
Figure 5B:
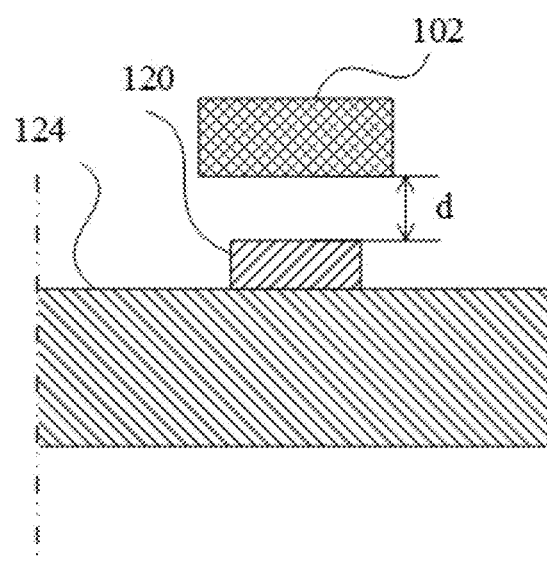
FIG. 5b is a cross-sectional view taken along the line X-X of FIG. 5a illustrating an error when a distance d between the current path and the sensor deviates from a predetermined value.

In addition, also in terms of the distance d between the conductive pattern 120 and the current sensor 102, hitherto, when the predetermined distance d is set in a cross-sectional view taken along the line X-X of FIG. 5(a), which is illustrated in FIG. 5(b), a measurement result contains the following error for an error of 5% for the distance d.

$1.05^2$−1=10.3%

Therefore, it has been necessary to perform highly precise positioning.

In contrast, according to the method 200, it is possible to calibrate the measurement current in a comprehensive manner to derive a correction expression to be applied to a measured value without the need to perform such highly precise angle alignment and positioning on the current sensor 102.

Note that, in the description of the embodiment, the measurement target is the current path, namely, the conductive pattern 120, but the measurement target may be a component such as an inductor, a circuit device such as a DC-DC converter, or the like.

Note that, in the method 200 according to the present embodiments or other methods described below, appropriate values are to be selected depending on the measurement target as measurement parameters such as a sampling interval and the number of sampling points to be used by the ADC 112 to obtain a first waveform or another waveform.

Another embodiment will be described. As set forth above, the transfer function $G_{ut}$ may be estimated even under a state in which the measurement target does not operate. However, when the relationship between a current and a magnetic flux is a non-linear relationship and the transfer function $G_{ut}$ needs to be obtained under the state in which the measurement target actually operates, the calibration current $I_{cal}(t)$ is required to be applied under the state in which the measurement target operates. In that case, it may be necessary to cause the calibration current $I_{cal}(t)$ to flow with as little influence on the operation of the measurement target as possible. For example, it is not desirable that as a result of causing the calibration current to flow, a parasitic capacitance that does not exist in the conductive pattern 120 under a normal condition increases to change the current flowing through the current path or oscillate the measurement target.

Considering this, a description is given of another embodiment of the calibration current superimposing unit 108 that may be applied to the first embodiment and makes the calibration current superimposing unit 108 less invasive.

Figure 3A:
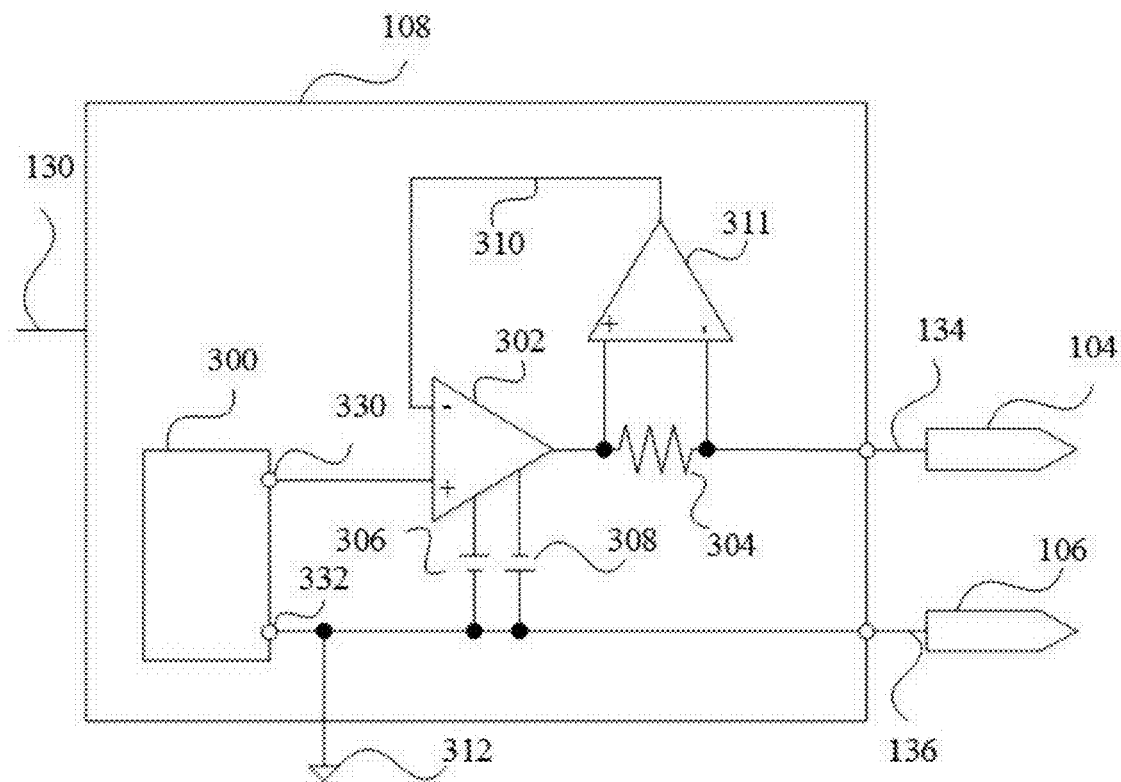
FIG. 3a is a block diagram illustrating an embodiment of the calibration current superimposing unit of FIG. 1.

As illustrated in FIG. 3(a), the calibration current superimposing unit 108 includes, as described above, the electrodes 104 and 106 for current superimposition, which are provided through the first cable 134 and the second cable 136 for current superimposition, and the control line 130.

The calibration current superimposing unit 108 may further include a floating current source 300 including output terminals 330 and 332, an amplifier (operational amplifier) 302 having a positive input terminal connected to the output terminal 330, a current detection resistor 304 connected to an output of the amplifier 302, and a floating ground terminal 312 connected to the output terminal 332. The calibration current superimposing unit 108 may further include a differential amplifier 311 having inputs connected to respective terminals of the current detection resistor 304, and the differential amplifier 311 feeds back an output that is based on a potential difference between the terminals of the current detection resistor 304 to a negative input terminal of the amplifier 302 through a wire 310. The calibration current superimposing unit 108 further includes a first power supply 306 and a second power supply 308 having different polarities, which are connected to the amplifier 302 from a point between the output terminal 332 and the second cable 136 for current superimposition. Note that an isolated power supply or a battery may be used as the first and second power supplies 306 and 308.

Figure 3B:
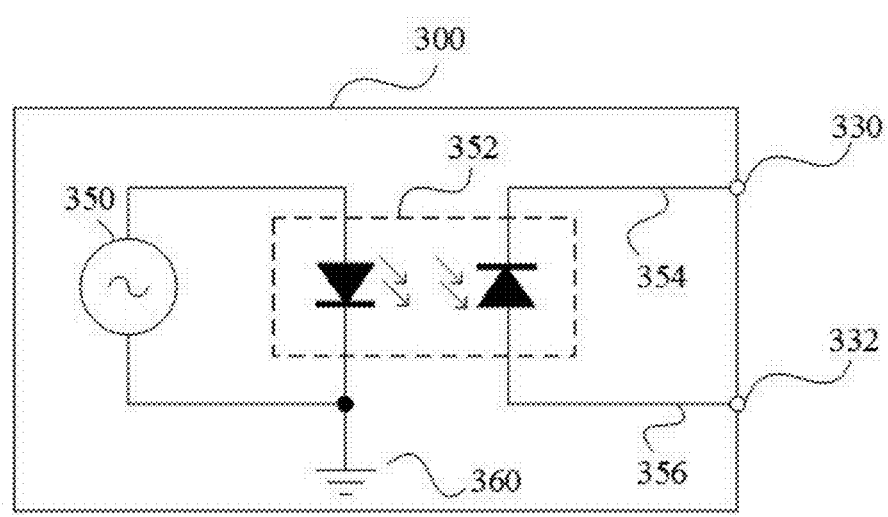

As illustrated in FIG. 3(b), the floating current source 300 may include a signal source 350 including two output terminals, a ground terminal 360 connected to one of the output terminals of the signal source 350, a light-emitting side of a photo-coupler 352, which is connected between the other output terminal and the ground terminal 360, and output-side wires 354 and 356 for outputting the signal from the signal source 350 through a light-receiving side of the photo-coupler 352 to the output terminals 330 and 332. It is to be noted that the floating ground terminal 312 is insulated from a ground potential of the ground terminal 360 and the current measurement device 100 and floats from the ground potential.

As described above, through the use of the photo-coupler 352 as an interface between the signal source included in the floating current source 300 and another circuit, an impedance of the ground potential of the conductive pattern 120 as the measurement target and the ground of the calibration current superimposing unit 108 is configured to be high. With this configuration, it is possible to achieve insulation of, for example, less than 1 pF. Furthermore, through the use of an isolated power supply or a battery as the first and second power supplies 306 and 308 of the amplifier 302, it is possible to enhance the insulation between the calibration current superimposing unit 108 and another external circuit. The photo-coupler 352 defines a signal isolator.

Accordingly, with the configuration described above, the calibration current superimposing unit 108 may output a current having a desired frequency and a desired amplitude with high precision. Furthermore, with the configuration of the floating current source 300, it is possible to prevent or limit a ground loop to a circuit on the current measurement side from being formed. Thus, it is possible to reduce effects due to the calibration current superimposing unit 108 at the time of current measurement, such as an increase in parasitic capacitance, a change in current flowing through the measurement target, and oscillation of the measurement target, to an extremely small degree. It is therefore possible to realize highly precise current measurement.

Another embodiment is now described. In the first embodiment described above, the calibration current $I_{cal}(t)$ may have various characteristics as a predetermined characteristic, and may be a sinusoidal wave having a single frequency as well as a sinusoidal wave having a plurality of frequency components. In this manner, it is possible to obtain the transfer function suited to the frequency characteristic of the circuit of the measurement target.

Furthermore, the calibration current having the plurality of frequency components as its characteristics is used, and the analysis is performed in Step 210. Then, among the extracted characteristics, an extracted value that differs from a given characteristic value by a predetermined ratio or more is not adopted in the calculation of the transfer function on suspicion that interference with the current under test may occur, and only the remaining characteristics may be used in the calculation. In other words, when the amplitude of the one of the plurality of predetermined frequency components is noisy, the data should not be used for estimating the transfer function.

Furthermore, by using a plurality of sinusoidal waves having a plurality of amplitudes and repeating calibration operations a plurality of times, it is possible to obtain the transfer function suited to a linear characteristic of the transfer function for the circuit of the measurement target. For example, when non-linearity of the transfer function is significant depending on a frequency or a quantity of current in an inductor, it may be desired that such a method be used in combination.

Furthermore, when the current under test has a pulse shape, through the use of a pulse waveform as the calibration current, it is possible to estimate the transfer function based on a signal having a frequency component close to the current under test, and hence it is possible to acquire the transfer function more accurately than when the calibration current having a single frequency component is used.

Furthermore, by using an M-sequence waveform as the calibration current instead of a sinusoidal wave and applying the calibration current having flat and wide-range frequency components, it is possible to obtain the transfer function suited to the transfer function having various characteristics. In this case, a parameter may be obtained based on, as an analysis method, an estimation method such as a least squares method.

Figure 6:
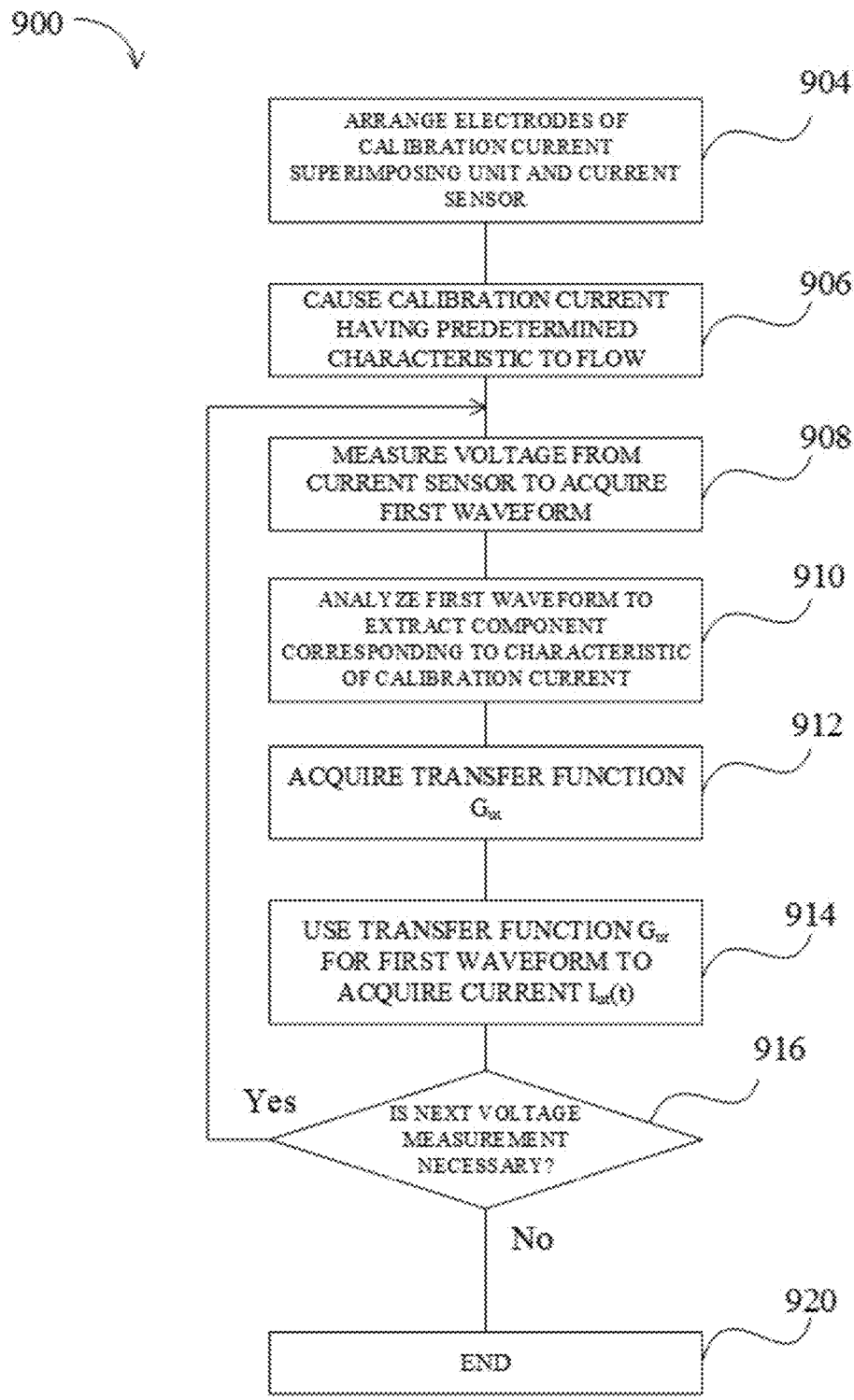
FIG. 6 is a flowchart illustrating another current measurement method to be performed by the device of FIG. 1.

Another embodiment is described. A measurement method is illustrated in FIG. 6 as a method 900 (as an embodiment other than the method 200). This method is a method of measuring the current of the measurement target while causing the calibration current to flow at all times. Steps 904 to 912 are the same as Steps 204 to 212 of the method 200.

When the transfer function $G_{ut}$ is acquired in Step 912, in Step 914, the controller 110 applies the transfer function $G_{ut}$ to the first waveform acquired in Step 908 to calculate $I_{ut}(t)+I_{cal}(t)$, and also uses the extraction result acquired in Step 910 to calculate the current $I_{ut}(t)$. Next, in Step 916, it is determined whether or not the next voltage measurement is necessary. When the next voltage measurement is necessary, the processing returns to Step 908. When the next voltage measurement is unnecessary, the processing proceeds to Step 920, and then the processing ends.

Through the use of the method 900, it is possible to perform measurement while superimposing the calibration current on the current under test flowing through the conductive pattern 120 under a normal condition at all times and to perform measurement while correcting fluctuations in the distance and angle between the current sensor 102 and the conductive pattern 120 as the measurement target. Accordingly, calibration is performed at all times at the time of measurement, and hence the method 900 is effective when the current sensor 102 is held by a hand or the measurement performed under an environment in which vibration or a temperature change may occur.

As another advantageous effect, the method 900 is effective when the transfer function $G_{ut}$ for the measurement target has non-linearity and changes depending on a quantity of current because by continuing the measurement while superimposing the calibration current on the current under test, it is possible to measure the current under test while calculating appropriate $G_{ut}$ suited to a current quantity of the measurement target. Note that it is desirable that the amplitude of the calibration current in this case be made sufficiently small with respect to the non-linearity of the measurement target.

Furthermore, the embodiment of the method 900 may be combined with other embodiments described herein.

Figure 7:
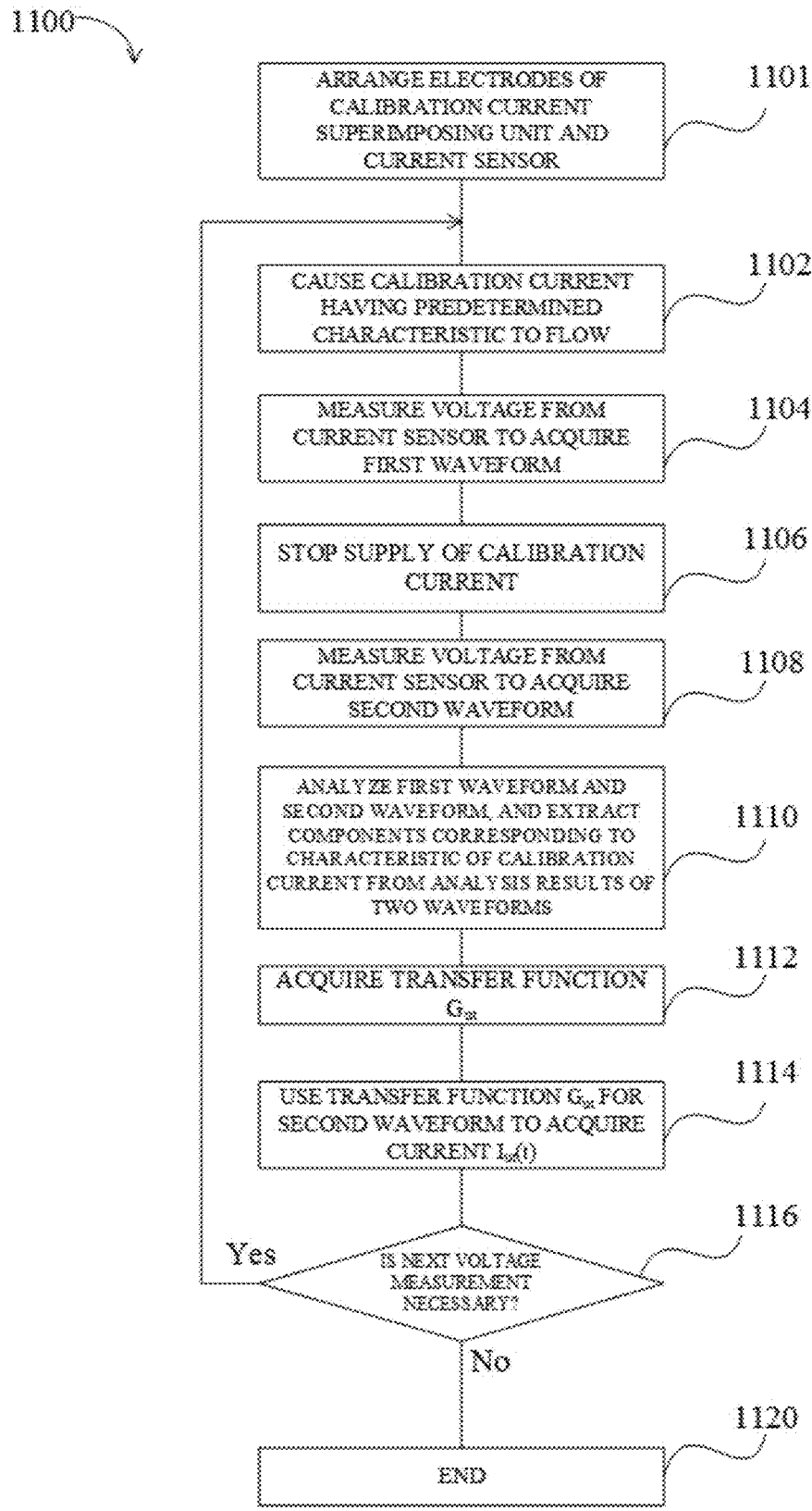
FIG. 7 is a flowchart illustrating still another current measurement method to be performed by the device of FIG. 1.

Another embodiment is described. A measurement method is illustrated in FIG. 7 as a method 1100 (as still another embodiment other than the methods 200 and 900). This method is a method involving measuring the first waveform under the state in which the calibration current is superimposed and the second waveform under the state in which the calibration current is not imposed, analyzing the respective waveforms, extracting components corresponding to the characteristic of the calibration current from analysis results of two waveforms to calculate the transfer function, and acquiring a measured current waveform that is corrected based on the second waveform using the transfer function.

Steps 1101 to 1106 are the same as Steps 204 to 208, 213 of the method 200, and hence a description thereof is omitted. In Step 1108, under the state in which the calibration current does not flow, the output voltage of the current sensor 102 is measured to acquire the second waveform.

Next, in Step 1110, the first waveform and the second waveform are analyzed, and components corresponding to the characteristic of the calibration current are extracted from analysis results of the first waveform and the second waveform. Specifically, it is assumed that the calibration current has the frequency components of the amplitude $A_1$ and the frequency $f_1$ as the characteristic, and as a result of subjecting each of the first waveform and the second waveform to a frequency analysis such as an FFT, the amplitude $A_{m1}$ at the frequency $f_1$ when the calibration current is superimposed and an amplitude $A_{m2}$ at the frequency $f_1$ when the calibration current is not superimposed is extracted. When it is assumed that a current fluctuation that is not caused by the calibration current at the frequency $f_1$ when the two waveforms are measured may be ignored, from this result, an amplitude of the calibration current at the measured voltage may be calculated as an amplitude difference $A_{m1}-A_{m2}$. From this result, the transfer function $G_{ut}$ is calculated based on Expression (3) in Step 1112, and in Step 1114, a measured current waveform $I_{ut}(t)$ after correction of the second waveform is calculated based on Expression (4).

Next, in Step 1116, it is determined whether or not the next voltage measurement is necessary. When the next voltage measurement is necessary, the processing returns to Step 1102. When the next voltage measurement is unnecessary, the processing proceeds to Step 1120, and then the processing ends.

According to the method 1100, the first waveform with the calibration current superimposed on the current under test needs to be measured at all times before the measurement of the second waveform of the current under test, and the calibration is performed every time. However, there is an advantage in that accurate current measurement may be performed independent of the characteristic of the current under test as long as the current under test is stable to some extent during a period between the measurement of the first waveform and the measurement of the second waveform. In other words, according to the method 1100, even when the calibration current does not always interfere less with the current under test as its predetermined characteristic, that is, for example, even when the calibration current has such a characteristic as to have the same frequency component as the current under test, a unique characteristic of the current under test may be cancelled and thereby calibrated correctly.

Note that, in the method 1100, the order of Steps 1102 to 1106 and the order of Step 1108 may be switched with each other.

Furthermore, the embodiment of the method 1100 may be combined with other embodiments described herein.

Figure 8:
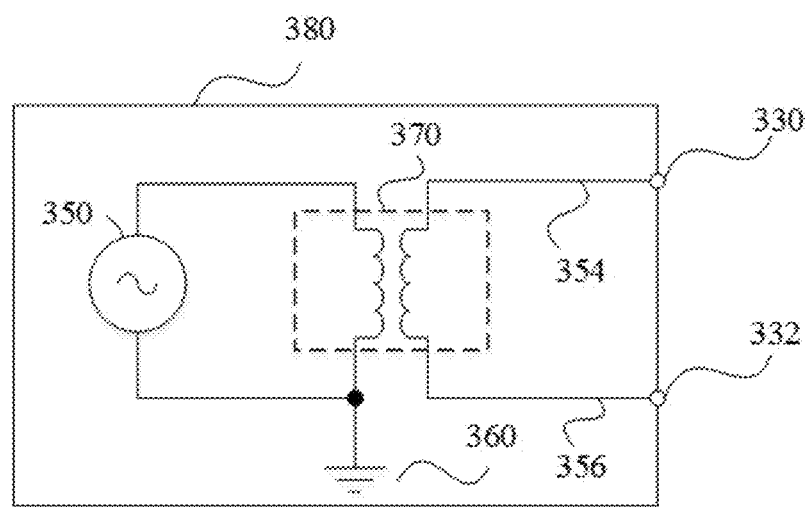
FIG. 8 is a block diagram illustrating an embodiment alternative of the floating current source of FIG. 3b.

Another embodiment is described. A floating current source 380 illustrated in FIG. 8 may be used as an alternative embodiment to the floating current source 300 of FIG. 3(b) in the embodiments of FIG. 1 to FIG. 3, FIG. 6, and FIG. 7. The floating current source 380 includes a transformer 370 in place of the photo-coupler 352 of FIG. 3(b) so as to have an corresponding isolation function.

Figure 9A:
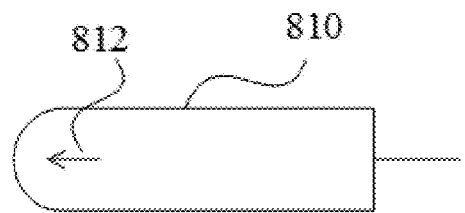
FIGS. 9a to 9c are conceptual diagrams of sensor structures for illustrating modified examples of a sensor element to be mounted in a sensor.
Figure 9B:
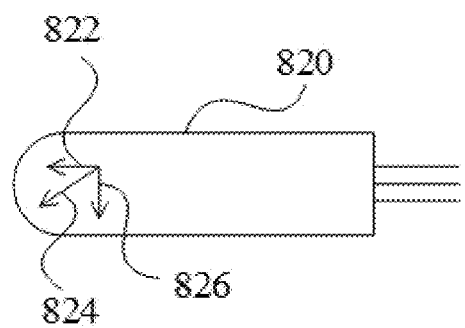
Figure 9C:
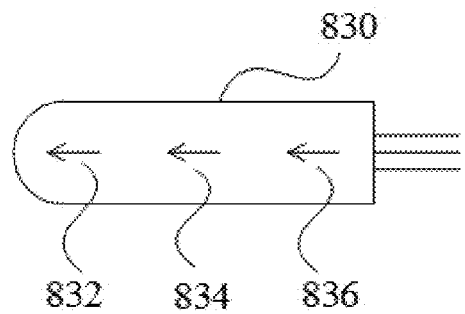

Another embodiment is described. It is possible to use, as the current sensor in the embodiments of FIG. 1 to FIG. 3 and FIG. 6 to FIG. 8, a current sensor 810 illustrated in FIG. 9(a) including a sensor element 812 having a single sensitivity axis as well as a sensor 820 of FIG. 9(b) including sensor elements 822, 824, and 826 so as to have a plurality of sensitivity axes or a sensor 830 of FIG. 9(c) including sensor element 832, 834, and 836 located at a plurality of positions. With this, when correction is insufficient only through calculation because the sensitivity is too high or low, or when correction is difficult only through calculation because the sensitivity varies too much depending on the distance or an angle, in FIG. 9(b), one of the sensor elements having a sensitivity axis appropriate for correction may be selected from among the sensor elements 822, 824, and 826 having the plurality of sensitivity axes. Similarly, in FIG. 9(c), one of the sensor elements located at a position appropriate for correction may be selected from among the sensor element 832, 834, and 836 located at the plurality of positions. It is therefore possible to realize effective calibration.

The position/axis of each of the sensor elements 822, 824, 826, 832, 834, 836 of the current sensor 810 may be made movable so as to enlarge the range in which the sensitivity is corrected. Also, it is possible to appropriately adjust the sensitivity of the current sensor 810 by including a magnetic shield.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems, for example, as discussed above.

While representative embodiments are disclosed herein, one of ordinary skill in the art appreciates that many variations that are in accordance with the present teachings are possible and remain within the scope of the appended claim set. The invention therefore is not to be restricted except within the scope of the appended claims.

The invention claimed is:

1. A current measurement device for use with a measurement target having a conductive path, the current measurement device comprising:
   a non-contact current sensor to be positioned adjacent the conductive path of the measurement target;
   a calibration current superimposing unit, including a first electrode and a second electrode to be positioned in contact with the conductive path of the measurement target, and configured to output a calibration current to flow through the conductive path between the first electrode and the second electrode; and
   a controller, coupled to the non-contact current sensor and the calibration current superimposing unit, and configured to control the output of the calibration current from the calibration current superimposing unit, and configured to sample a signal from the non-contact current sensor positioned adjacent the conductive path of the measurement target.

2. The current measurement device according to claim 1, wherein the calibration current superimposing unit comprises:
   a floating current source comprising a first output terminal and a second output terminal;
   an amplifier connected to the first output terminal of the floating current source; and
   a floating ground terminal connected to the second output terminal of the floating current source.

3. The current measurement device according to claim 2, wherein the floating current source comprises:
   a signal source;
   a signal isolator configured to output an output of the signal source to the first output terminal and the second output terminal; and
   a ground terminal connected to an output of the signal source, and insulated from the floating ground terminal.

4. The current measurement device according to claim 1, wherein the calibration current superimposing unit is configured to output the calibration current having a signal component of a first amplitude at a first frequency.

5. The current measurement device according to claim 1, wherein the calibration current superimposing unit is configured to output the calibration current as a pulse waveform.

6. The current measurement device according to claim 1, wherein the calibration current superimposing unit is configured to output the calibration current as an M-sequence waveform.

7. The current measurement device according to claim 1, further comprising a first positioner and a second positioner, configured to position the first electrode and the second electrode, respectively, to be in contact with a conductive pattern of the measurement target.

8. The current measurement device according to claim 7, further comprising a third positioner for positioning the non-contact current sensor adjacent the conductive path of the measurement target.

9. A method of measuring a current flowing through a measurement target with a current measurement device that includes a non-contact current sensor and a calibration current superimposing unit comprising a first electrode and a second electrode, the method comprising:
  positioning the non-contact current sensor adjacent a conductive pattern of the measurement target;
  positioning the first electrode and the second electrode in contact with the conductive pattern of the measurement target;
  causing a calibration current to flow through the measurement target between the first electrode and the second electrode from the calibration current superimposing unit; and
  measuring a signal from the non-contact current sensor adjacent the conductive pattern of the measurement target.

10. The method according to claim 9, wherein the calibration current includes a predetermined characteristic; and further comprising
  extracting a component corresponding to the predetermined characteristic of the calibration current by analyzing the measured signal;
  acquiring a transfer function of the measurement target from the extracted component; and
  acquiring a corrected current value through use of the transfer function.

11. The method according to claim 10, further comprising stopping flow of the calibration current after measuring; and wherein acquiring the corrected current value comprises measuring a subsequent signal from the non-contact current sensor and acquiring the corrected current value by applying the transfer function to the subsequent measured signal.

12. The method according to claim 10, wherein acquiring the corrected current value comprises acquiring the corrected current value by applying the transfer function to a value of the measured signal.

13. The method according to claim 10, wherein the predetermined characteristic of the calibration current comprises a signal component of a first amplitude at a first frequency.

14. The method according to claim 10, wherein the predetermined characteristic of the calibration current comprises a plurality of predetermined frequency components; and wherein acquiring the transfer function comprises avoiding using one of the plurality of predetermined frequency components to acquire the transfer function based upon a deviation of an amplitude extracted for the one of the plurality of predetermined frequency components of the calibration current.

15. The method according to claim 9, wherein positioning the first electrode and the second electrode comprises positioning the first electrode and the second electrode through use of a first positioner and a second positioner, respectively.

16. The method according to claim 15, wherein positioning the non-contact current sensor comprises positioning the non-contact current sensor, adjacent the conductive pattern of the measurement target, through use of a third positioner.

17. A method of measuring a current flowing through a measurement target with a current measurement device that includes a non-contact current sensor, a calibration current superimposing unit comprising a first electrode and a second electrode, the method comprising:
  positioning the non-contact current sensor adjacent a conductive pattern of the measurement target;
  positioning the first electrode and the second electrode in contact with the conductive pattern of the measurement target;
  causing a calibration current having a predetermined characteristic to flow through the measurement target between the first electrode and the second electrode from the calibration current superimposing unit;
  acquiring a first waveform by measuring a voltage signal from the non-contact current sensor adjacent the conductive pattern of the measurement target;
  stopping flow of the calibration current;
  acquiring a second waveform by measuring a second voltage signal from the non-contact current sensor;
  extracting a component corresponding to the predetermined characteristic of the calibration current by analyzing the first waveform and the second waveform;
  acquiring a transfer function of the measurement target from the extracted component; and
  acquiring a corrected current value through use of the transfer function.

18. The method according to claim 17, wherein extracting the component corresponding to the predetermined characteristic comprises subjecting each of the first waveform and the second waveform to a frequency analysis to calculate a difference in amplitude at a predetermined frequency.

19. The method according to claim 17, wherein acquiring the corrected current value comprises applying the transfer function to a value of the second waveform to acquire the corrected current value.

20. The method according to claim 17, wherein positioning the first electrode and the second electrode comprises positioning the first electrode and the second electrode through use of a first positioner and a second positioner, respectively; and wherein positioning the non-contact current sensor comprises positioning the non-contact current sensor through use of a third positioner.

* * * * *